United States Patent [19]

Yoda et al.

[11] Patent Number: 4,649,345
[45] Date of Patent: Mar. 10, 1987

[54] NMR IMAGING METHOD

[75] Inventors: Kiyoshi Yoda; Hidenobu Itagaki; Satoshi Fujimura; Tadatoshi Yamada, all of Hyogo, Japan

[73] Assignee: Mitsubishi Denki Kabushiki Kaisha, Tokyo, Japan

[21] Appl. No.: 766,316

[22] Filed: Aug. 16, 1985

[30] Foreign Application Priority Data

Aug. 17, 1984 [JP] Japan .................. 59-172027
Apr. 10, 1985 [JP] Japan .................. 60-77684

[51] Int. Cl.$^4$ ........................... G01R 33/20
[52] U.S. Cl. ..................... 324/309; 324/307
[58] Field of Search ............ 324/307, 309, 312, 313, 324/314, 300; 128/653

[56] References Cited

U.S. PATENT DOCUMENTS 4,451,788  5/1984  Edelstein et al. ............ 324/309
4,532,474  7/1985  Edelstein ..................... 324/312

FOREIGN PATENT DOCUMENTS 2125563  3/1984  United Kingdom ............ 324/309

Primary Examiner—Jerry W. Myracle
Assistant Examiner—Kevin D. O'Shea
Attorney, Agent, or Firm—Sughrue, Mion, Zinn, Macpeak & Seas

[57] ABSTRACT

A nuclear magnetic resonance imaging method in which the time necessary for forming a two-dimensional image of a single plane of a sample is significantly reduced, making the method applicable for imaging of the human heart or the like. First, nuclear spin is excited in a given volume of a sample disposed in a magnetostatic field. Secondly, first, second and third oblique magnetic fields are applied to the volume. Thirdly, the nuclear spin is rephased under the second magnetic field gradient by applying a 180° pulse. Fourthly, the nuclear spin is phase modulated in the direction of the third magnetic field gradient prior to or following read out of a spin echo signal derived from the rephasing of the spin. Fifthly, the first through fourth steps are repeated, wherein the third magnetic field gradient in each of the repetitions of the fourth step has a constant absolute value and the direction of the third magnetic field gradient alternates.

17 Claims, 3 Drawing Figures

NMR IMAGING METHOD

BACKGROUND OF THE INVENTION

The present invention relates to a display method, particularly, a high speed display method for a nuclear magnetic resonance signal.

Nuclear magnetic resonance (NMR) relates to the fact that when nuclei are placed in a uniform magnetostatic field, they precess around magnetic lines of force at a frequency proportional to an intensity of the field. This frequency, known as the Larmor frequency, is given by $\omega_0 = \gamma H_0$, where $\gamma$ is the gyromagnetic ratio of the nucleus and $H_0$ is the magnetic field intensity. When the magnetostatic field intensity is varied in a certain direction, nuclei in various positions along the direction precess at different frequencies. When both an oblique magnetic field namely, magnetostatic field with magnetic field gradients and a pulsed RF magnetic field of sufficient magnitude are applied to a sample material, only nuclei having spins which precess at the RF magnetic field pulse frequency are rotated by 90° or 180°, and thus they can be isolated from other nuclei.

In British Pat. No. 2,079,946, it is proposed to obtain a two-dimensional image of such a sample using the so-called "spin warp" method. Summarizing the spin warp method, a thin slab of material is assigned in the substance and the latter is disposed in a combination field of a first magnetic field gradient parallel to the slab and a second magnetic field gradient parallel to the slab and orthogonal to the first field gradient. The first gradient is then inverted to detect a free induction signal (FIS). The FIS is produced by spins which are dephased firstly by the first magnetic field gradient and then rephased to form spin echoes. When the spin echos are sampled $N_x$ times, a Fourier transformation of the spin echo signals gives a projection of spin density on a line parallel to the first magnetic field gradient so as to change phases of respective spins in the direction thereof. The above procedure is repeated for $N_z$ values of the second magnetic field gradient, and Fourier-transformed outputs are obtained, resulting in a matrix of density values of size $N_x \times N_z$. Therefore, a formation of a two-dimensional image of a certain plane in the sample can be realized.

In the conventional display method using NMR such as the spin warp method, the time period necessary to form a two-dimensional image of a single plane of a substance is typically on the order of $N_z$ seconds, which is not short enough to form a good image of a human organ such as beating heart.

SUMMARY OF THE INVENTION

An object of this invention is to provide a method of producing a display of information contained in an NMR signal obtained from a slice of a sample material in which the time necessary to form the latter signal is considerably shortened.

The above object is achieved, according to the invention, by, firstly, exciting nuclear spin in a certain volume of a sample material disposed in a magnetostatic field, secondly, applying first, second and third magnetic field gradients to the sample, thirdly, rephasing the nuclear spin using a pulsed 180° RF. magnetic field under the second magnetic field gradient, fourthly, phase-modulating the nuclear spin in the direction of the third magnetic field gradient before or after reading out of spin echo signals obtained by rephasing, and, fifthly, repeating the above steps sequentially in the stated order, with the third magnetic field gradient in the fourth step being alternated in direction and with a constant absolute value of time integration of intensity.

The RF pulse used for the nuclear spin excitation and the measurement may be that of a Carr, Purcell, Meiboom, Gill (CPMG) series which is repeated plural times with a predetermined interval to obtain a plurality of spin echo signals. The amount of phase modulation may be changed for every spin echo signal so that absolute values of the respective amounts of phase modulation form an arithmetic progression with the first term being 0.

DESCRIPTION OF THE PREFERRED EMBODIMENTS

An NMR imaging apparatus to be used for performing the present invention may be any conventional one in which a magnetostatic field $H_0$ is applied in, for example, the z-axis direction orthogonal to an arbitrary slice surface of a sample material and a high frequency magnetic field pulse is applied in the x- or y-axis direction orthogonal to the z axis. Receiving of the NMR signal may be performed using Quadrative Detection (QD) for measuring cosine and sine components having a phase differing by 90°. The apparatus includes field generating coils for producing magnetic field gradients $G_x$, $G_y$ and $G_z$ in respective x, y and z directions orthogonal to each other, as disclosed in, for example, "Journal of Physics E: Scientific Instruments", vol. 13, pages 947–955.

Figure 1:
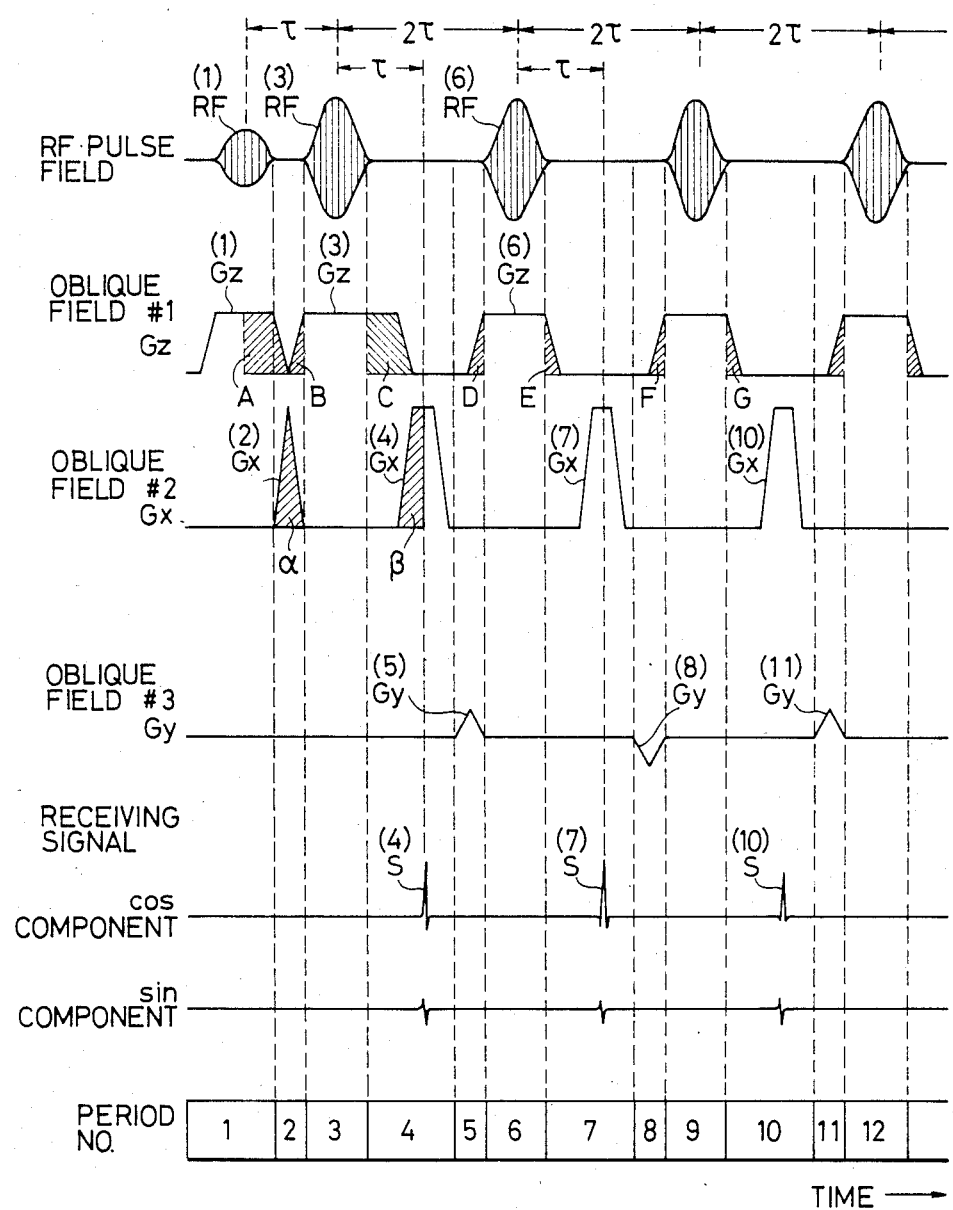
FIG. 1 shows a pulse sequence of an NMR imaging method according to a preferred embodiment of the present invention.

FIG. 1 shows a measuring sequence according to a preferred embodiment of the present invention.

Magnetic pulses are applied in respective Periods Nos. 1, 3, 6, 9, 12, etc., as shown in FIG. 1, in which nuclear spin in a certain volume of a sample in a magnetostatic field is excited in Period No. 1 and the excited spin is rephased by using 180° out-of-phase pulses to observe spin echo signals in Period No. 2 and subsequent periods.

Period No. 1

A high frequency RF magnetic field RF(1), 90% RF pulse, is applied together with a first magnetic field gradient $G_z(1)$ to the sample, with second and third magnetic field gradients $G_x$ and $G_y$ being zero. With application of the fields RF(1) and $G_z(1)$ to the sample, nuclear spin in a sample since having a certain thickness is selectively excited, depending upon the frequency of the RF field RF(1). The thickness of the slice can be varied by changing the bandwidth of the RF pulse or the amplitude of the field gradient $G_z(1)$.

Period No. 2

The second field gradient $G_x(2)$ is applied to the sample for a measurement of a spin echo signal S(4) in Period No. 4 under a second field gradient $G_x(4)$.

Period No. 3

A 180° RF pulse RF(3) is applied together with the first field gradient $G_z(3)$ to generate the spin echo signal S(4). At this time, values A, B and C (hatched portions) of time integration of the field gradient $G_z$ are assumed to satisfy $A+B=C$, and disturbances of spin due to $G_z$ are compensated for, as is disclosed in, for example, P. R. Locher, "Proton NMR Tomography", Philips Technical Rev. 41, 73–88.

Possible signal attenuation due to an incompleteness of the 180° pulse is avoided by shifting the phase of 180° pulse from that of the 90° pulse by 90°, as is disclosed in, for example, S. Meiboom et al., Rev. Sci. Instr. 29, 688, 1958.

Period No. 4

The spin echo signal S(4) is observed under the second field gradient $G_x(4)$. During the observation of the signal S(4), only the constant field gradient $G_x(4)$ is applied. The maximum value of the absorbed component of the spin echo signal may be observed a time instant $\tau$ after a time instant at which the maximum value of the 180° pulse is given. Hatched regions $\alpha$ and $\beta$ are the same with respect to the second field $G_x$.

Period No. 5

The third field gradient $G_y(5)$ for phase modulation is applied for observation of a phase modulated spin echo signal S(7) in Period No. 7. The magnitude of $G_y(5)$ satisfies $\gamma L_y \int G_y(5)dt \leq 2\pi$, where $L_y$ is the length of the object to be measured in the y direction.

Period No. 6

A 180° RF pulse RF(6) is applied together with the first field gradient $G_z(6)$ to obtain the spin echo signal S(7).

Hatched regions D and E are equal in area to each other. The interval between the 90° pulse RF(1) and the 180° pulse RF(3) is $\tau$, and the interval between adjacent 180° pulses is $2\tau$.

Period No. 7

The same fields as those in Period No. 4 are applied. The amplitude of $G_x(4)$ is the same as that of $G_x(7)$. Practically, the amplitudes of $G_x(4)$, $G_x(7)$, $G_x(10)$ ... are the same, and $\int 2G_x(2)dt = \int G_x(4)dt = \int G_x(7) dt = \int G_x(10)dt = \ldots$

Period No. 8

The third field gradient $G_y(8)$ for phase modulation is applied. In this period, $G_y(8)$ and $G_y(5)$ satisfy $\int G_y(8)dt = -\int G_y(5)dt$. The integration is performed for the time during which the respective field gradients are applied throughout the measuring period.

Period No. 9

The same fields as those in Period No. 6 are applied. Hatched regions F and G are equal in area.

Period No. 10

The same fields as those in Period No. 7 are applied.

Period No. 11

The same fields as those in Period No. 5 are applied and $\int G_y(11)dt = \int G_y(5)dt$.

Period No. 12 and subsequent Periods

The conditions in Period Nos. 6 through 11 are repeated sequentially.

According to the pulse sequence described above, the amount of phase modulation of the (n+1)th spin echo can be expressed by $(-1)^n n \gamma \int G_y(5)dt \cdot y$, where n=0, 1, ..., N/2.

An embodiment of the inventive method for processing the spin echo signals will be described. It should be noted that any other processing method which is mathematically equivalent to that described can be used with the same result.

The phase of the (n+1)th spin echo at a time t is represented by $\gamma G_x tx + (-1)^n n\gamma \int G_y(5)dt \cdot y$, where the origin point in time is that time at which the maximum spin echo signal (absorption component) occurs.

Assuming $\gamma L_y \int G_y(5)dt = 2\pi$ and that the spin echo signal at t is S(t,n) (neglecting a proportional constant), $S(t,n) = \int \int \rho(x,y) \cdot \exp(j\gamma G_x tX)\exp((j2\pi ny(-1)^n)/L_y)dxdy$, where (x,y) is the spin density and where the transverse relaxation effect during the measuring time period is neglected.

Then, sampling is performed such that $\gamma L_x G_x t \leq 2\pi m$, where $m = M/2, \ldots, (M/2)-1$, with M being the sampling time number of S(t,n).

For example, when $L_x G_x t = 2 m$, $$S(m,n) = \int \int \rho(x,y)\exp(2\pi jmx/L_x) \cdot \exp(2\pi jny(-1)^n/L_y)dxdy \quad (1)$$

where $L_x$ is the length of the object to be measured in the x direction.

In the equation (1), for $k = (-1)^n n$, $$S(m,k) = \int \int \rho(x,y)\exp(2\pi jmx/L_x)\exp(2\pi jky/L_y)dxdy, \quad (2)$$

where $m = (M/2), \ldots, (M/2)-1$ and $k = 0, -1, 2, -3, \ldots, (-1)^{N/2} \cdot N/2$.

That is, the spin density $\rho(x,y)$ of the object to be measured can be obtained by Fourier transforming the received signal S(m,k) two-dimensionally. For k, $S(m,-k) = S(-m,k)^*$ where * is complex conjugate operator. That is, it is possible to calculate value at $k = -(N/2), \ldots, (N/2)-1$ from measured values at $k = 0, -1, 2, -3, \ldots, (-1)^{N/2} \cdot N/2$ for an arbitrary time m.

Practically, considering $u(m,k) = a(t) + jb(t)$ for a cosine component a(t) and a sinusoidal component b(t) obtained by the QD method, it becomes $u(m,k) = e^{j\phi}S(m,k)$ generally. However, since the absolute value of spin density after calculation is significant, u(m,n) can be replaced by $u(m,-k) = u(-m,k)^*$ with the same caluculation result.

That is, $u(m,k) = \int \int e^{j\phi}\rho(x,y)\exp(2\pi jmx/L_x)\exp(2\pi jky/Ly)dxdy$.

Therefore, $e^{j\phi}\rho(x,y)$ is obtained from a(m,k) and the absolute value from $\rho(x,y)$.

As will be clear from the foregoing, the two-dimensional spin density of the object can be obtained by obtaining (N/2+1) spin echo signals, obtaining measurement values by sampling the respective echo signals at point M, obtaining M·N measurement values by calculation, and Fourier transforming them two dimensionally.

Although in the described embodiment, the phase disturbance of the spin in the z direction after selective excitation is compensated without reversing the first field gradient $G_z(1)$, it may be compensated by reversing the field gradient $G_z(1)$ as in the conventional manner. In the latter case, the areas B and C of $G_z(3)$ are made equal to each other.

Further, the envelope of the high frequency pulse used in this embodiment is of the Gaussian type. However, it may be possible to use a sinc function type envelope or rectangular waveform, or any combination thereof instead of the Gaussian type. If the 180° high frequency pulse has a rectangular waveform, the first field gradient $G_z$ to be applied simultaneously therewith may be omitted.

The waveforms of the field gradients used herein are trapezoidal for $G_x$ and $G_z$ and triangular for $G_y$. However, they may be rectangular. Particularly, the waveform of the third field gradient $G_y$ may be any provided that it satisfies:

$$\int G_y(5)dt = -\int G_y(8)dt = \int G_y(11)dt = \ldots$$

As to $G_x(2)$, the waveform thereof may be any provided that it is constant during the signal observation period and satisfies $\int 2G_x(2)dt = \int G_x(4)dt = \int G_x(7)dt = \int G_x(10)dt = \ldots$ As to $G_z$, shapes of the rising and falling portions thereof may be any provided that the field intensity thereof is constant during the application of the high frequency pulse field.

The phase of the 90° high frequency pulse may be made the same as that of 180° high frequency pulse.

Although in the above embodiment the third field gradient $G_y$ for phase modulation is applied in respective Periods Nos. 5, 8, . . . after spin echo signals are read out, it is possible to apply the field $G_y$ before reading out the spin echo signal. In such a case, the field gradient $G_y$ is applied in respective Periods Nos. 7, 10, . . .

Further, it is possible to make the third field $G_y$ a pulse train, and it is also possible to apply the field gradient $G_y$ several times before and after the reading out of the spin echo signal. In the latter case, the sum of time integration of individual field gradients may be considered as $\int G_y(5)dt$ mentioned previously.

When it is desired to obtain information concerning the longitudinal relaxation time ($T_1$), it is sufficient to add a process of reversing the nuclear spin prior to the first step (Period No. 1) by a time length substantially equal to the average longitudinal relaxation time of nuclear spin. The spin inversion may be performed by reversing the 180° pulse or by the use of the adiabatic fast passage disclosed in, for example, Farrar Becker, "Pulses and Fourier-Transformed NMR", Yoshioka Publishing Co., Ltd. In such case, it may be possible to apply the first field gradient together with the 180° pulse.

If it is desired to obtain information regarding the transverse relaxation time ($T_2$), it is sufficient to provide a time substantially equal to an average transverse relaxation time of the sample after the first step and to perform subsequent processing after that time has been lapsed.

Figure 2:
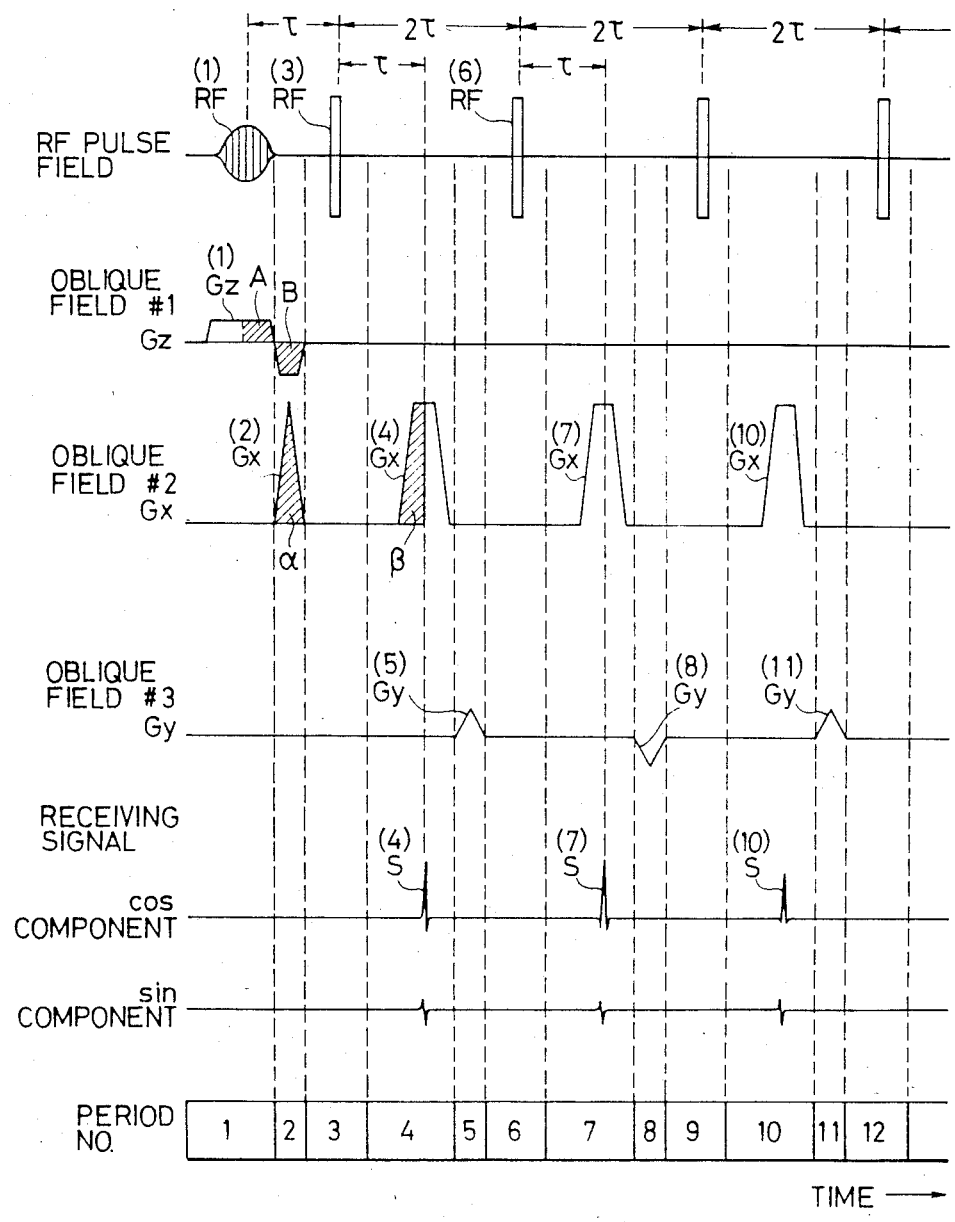
FIG. 2 shows a similar sequence for another embodiment of the present invention.

FIG. 2 shows another embodiment of the present invention.

The embodiment of FIG. 2 differs from that of FIG. 1 in that the first field gradient $G_z$ is applied to the sample only in Periods Nos. 1 and 2, with the field gradient $G_z$ in Period No. 2 being inverted and with the integration times A and B thereof being equal to each other, and in that the high frequency 180° pulse is rectangular in waveform.

By repeating Periods Nos. 6 to 11 in sequence until the total number of the 180° pulses applied is 2P, where P is an integer, 2P spin echo signals are obtained. Then, nuclear spin is excited again a recovery time of 0.1 to 5 seconds after the 2Pth spin echo signal is obtained to start a second sequence.

Figure 3:
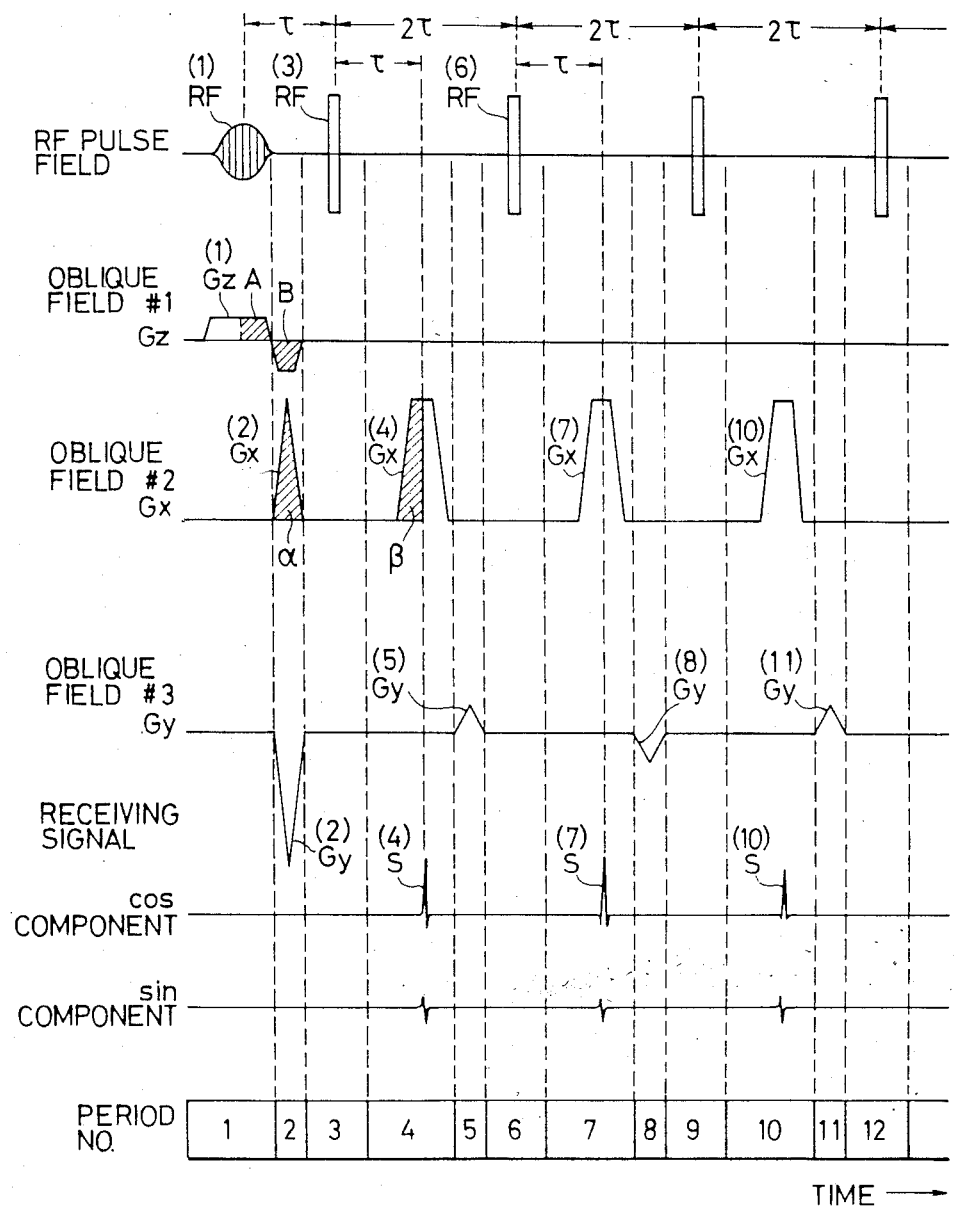
FIG. 3 shows a sequence similar to that shown in FIG. 2 for a further embodiment of the present invention.

The second sequence may be performed as shown in FIG. 3, which differs from the embodiment of FIG. 2 only in that the third field gradient $G_y$ is applied in Period No. 2, as shown by $G_y(2)$, with $\int G_y(2)dt = -4P\int G_y(5)dt$. That is, when the sequence in FIG. 3 is repeated Q times, $\int G_y(2)dt = -2PQ\int G_y(5)dt$ for $G_y(2)$ at the Qth time sequence. This sequence may be used in subsequent sequences with a recovery time therebetween.

Thus, a total of (N/2+1) spin echo signals are obtained, where N is an even integer. As a result, the phase modulation of the (n+1)th spin echo signal becomes $(-1)^n n \int G_y(5)dt \cdot y$, as in the embodiment of FIG. 1. That is, the absolute value of the pulse modulation is an arithmetic progression with the first term being 0.

The signal processing in the embodiments of FIG. 2 or FIG. 3 is the same as that in the embodiment of FIG. 1.

In these embodiments, the third field gradient $G_y$ in the Period No. 2 is varied sequentially so that the absolute value of phase modulation for respective spin echo signals becomes an arithmetic progression with the first term being 0. Although the sequence in FIG. 2 is followed by that in FIG. 3, this may be modified provided that, when the absolute values of phase modulation are arranged from the smallest to the largest in order, an arithmetic progression is formed with the first term being 0.

As described hereinbefore, the present invention includes a first step (Period No. 1) of exciting nuclear spin in a given sample disposed in a magnetostatic field, a second step (Period No. 2 and subsequent periods) of applying the first, second and third magnetic field gradients to the sample, a third step (Periods Nos. 3, 6, 9 and 12) of rephasing the nuclear spin by applying the 180° pulse fields together with the second field gradient a fourth step (Periods Nos. 5, 8 and 11) of phase-modulating the nuclear spin in the direction of the third field gradient prior or subsequent to a reading out of the spin echo signal obtained by the reimaging step, and a fifth step of repeating Periods Nos. 3 to 12. The third field gradient applied in the respective fourth steps is an alternating field gradient, with the absolute value of the time integral thereof being constant or with the amount of phase modulation being varied for respective echo signals so that, when the absolute values of phase modulation are arranged in order from the smallest to the largest, an arithmetic progression is formed with the first term being 0.

Therefore, the plural spin echo signals necessary for image formation can be measured sequentially. Since the recovery time in this case is shorter than that necessary in the conventional method, the measuring time can be shortened considerably, making the inventive NMR imaging method well applicable to the image formation of the thorax, and particularly the heart and abdominal region, with reduced influence of movements such as pulsation, peristalsis and respiration, etc., and with high spatial-time resolution. Further, according to the present invention, image formation of the bloodstream and lymph flow is facilitated. In addition, the capacity of power source needed for phase modulation is small, and hence the power source is inexpensive. Moreover, it is possible to shorten the total measuring time necessary to obtain a multislice image.

We claim:

1. An NMR imaging method comprising:
   a first step of exciting nuclear spin in a given volume of a sample disposed in a magnetostatic field;
   a second step of applying a first, a second and a third magnetic field gradient to said volume;
   a third step of rephasing the nuclear spin under said second magnetic field gradient by applying a 180° pulse;
   a fourth step of phase-modulating said nuclear spin in a direction of said third magnetic field gradient prior to or after reading out of a spin echo signal derived from said rephasing of said spin; and
   a fifth step of repeating said second to fourth steps, wherein said third magnetic field gradient in each of said fourth steps has a constant absolute value and a direction of said third magnetic field gradient is alternating.

2. The NMR imaging method as claimed in claim 1, where said first and second field gradients are orthogonal to each other.

3. The NMR imaging method as claimed in claim 1, wherein said first step is performed under said first gradient of the magnetic field which has a gradient direction perpendicular to an arbitrary slice surface of said sample.

4. The NMR imaging method as claimed in claim 1, wherein said third magnetic field in said fourth step comprises a series of magnetic pulse fields.

5. The NMR imaging method as claimed in claim 1, further comprising a step of processing a spin echo signal by means of a QD method for measuring a cosine component and a sine component different in phase from said cosine component by 90° of said spin echo signal.

6. The NMR imaging method as claimed in claim 1, further comprising, prior to said first step, a step of inverting said nuclear spin.

7. The NMR imaging method as claimed in claim 6, wherein said inverting step is performed by using a 180° pulse.

8. The NMR imaging method as claimed in claim 6, wherein said inverting step is performed by using an adiabatic fast passage.

9. An NMR imaging method comprising
   a first step of exciting nuclear spin in a given volume of a sample in a magnetostatic field;
   a second step of rephasing said nuclear spin by using a 180° pulse and measuring spin echo signals obtained therefrom, a high frequency pulse used in said steps 1 and 2 being a CPMG series of a 90° pulses and 180° pulses; and
   a third step of repeating said high frequency pulse series with a predetermined interval to obtain a plurality of spin echo signals while varying an amount of a pulse-modulation every said spin echo signal so that absolute values of the respective phase-modulations form an arithmetic progression with a first term being 0 when arranged in an order from a smallest value.

10. The NMR imaging method as claimed in claim 9, wherein said first step is performed under a first gradient of the magnetic field which has a gradient direction perpendicular to an arbitrary slice surface of said sample.

11. The NMR imaging method as claimed in claim 9, wherein a second magnetic field gradient is applied in a pulsed manner so that absolute value of phase modulation for respective spin echo signals is constant.

12. The NMR imaging method as claimed in claim 9, wherein a third magnetic field gradient is applied pulsedly so that an amount of phase modulation for said respective spin echo signals is varied every spin echo signal.

13. The NMR imaging method as claimed in claim 9, wherein said first, second and third oblique magnetic field are orthogonal to each other.

14. The NMR imaging method as claimed in claim 9, wherein said signals are processed by using a QD method for measuring a cosine component and a sine component differing in phase from said cosine component by 90° as a received signal.

15. The NMR imaging method as claimed in claim 9, further comprising, prior to application of said CPMG series of pulses, a step of inverting the nuclear spin.

16. The NMR imaging method as claimed in claim 15, wherein the inverting step is performed by using a 180° pulse.

17. The NMR imaging method as claimed in claim 15, wherein the inverting step is performed by using adiabatic fast passage.

* * * * *